United States Patent [19]

Shirato et al.

[11] Patent Number: 4,677,314

[45] Date of Patent: Jun. 30, 1987

[54] BUFFER CIRCUIT HAVING A P-CHANNEL OUTPUT MOSFET WITH AN OPEN DRAIN TERMINAL CONNECTED TO AN EXTERNAL LOAD

[75] Inventors: Takehide Shirato, Hiratsuka; Kouichi Fujita, Yokohama, both of Japan

[73] Assignee: Fujitsu Limited, Kawasaki, Japan

[21] Appl. No.: 913,580

[22] Filed: Sep. 30, 1986

Related U.S. Application Data

[63] Continuation of Ser. No. 833,529, Feb. 25, 1986, abandoned, which is a continuation of Ser. No. 775,693, Sep. 12, 1985, abandoned, which is a continuation of Ser. No. 393,113, Jun. 28, 1982, abandoned.

[30] Foreign Application Priority Data

Jun. 30, 1981 [JP] Japan .................. 56-100510

[51] Int. Cl.$^4$ .............. H03K 5/00; H03K 17/08; H03K 19/092; H01L 29/08
[52] U.S. Cl. .................. 307/270; 307/584; 307/577; 307/585; 307/475; 307/304; 357/23.9; 340/784; 340/785; 350/332
[58] Field of Search ............ 307/270, 450, 451, 452, 307/469, 475, 499, 501, 570, 571, 579, 584, 585, 304; 340/783-788, 794; 350/332, 333; 357/23 S, 23 CS

[56] References Cited

U.S. PATENT DOCUMENTS

| | | | |
|---|---|---|---|
| 3,596,347 | 8/1971 | Beale | 357/23 S X |
| 3,615,934 | 10/1971 | Bower | 357/23 S X |
| 3,657,568 | 4/1972 | Dargent | 307/585 X |
| 3,679,492 | 7/1972 | Fang et al. | 357/23 S X |
| 3,925,120 | 12/1975 | Saida et al. | 357/23 CS X |
| 3,997,813 | 12/1976 | Chan et al. | 340/800 |
| 4,072,937 | 2/1978 | Chu | 340/777 |
| 4,223,334 | 9/1980 | Gasner et al. | 357/42 |
| 4,232,327 | 11/1980 | Hsu | 357/23 |
| 4,257,832 | 3/1981 | Schwabe et al. | 357/23 S X |
| 4,268,847 | 5/1981 | Kurakami et al. | 357/23 CS X |

OTHER PUBLICATIONS

Fink et al., *Electronics Engineers' Handbook*, McGraw-Hill, Inc., pp. 16-15 through 16-19, 1982, (Ex'er book).

Ishaq et al., "Self-aligned FET Gate Structure and Method", IBM Tech. Discl. Bull., vol 26, No. 6, pp. 2680-2681, 11/83.

Ogura et al., "Design and Characteristics of the Lightly Doped Drain Source IGFET", IEEE Transactions on Electron Devices, vol. ED-27, No. 8, pp. 1359-1367, Aug. 80.

IBM Technical Disclosure Bulletin, "DMOS Raster-Scan Plasma Panel Drivers", by Oleszek et al., vol. 21, No. 3, Aug. 1978, pp. 1096-1098.

*Primary Examiner*—S. D. Miller
*Assistant Examiner*—David R. Bertelson
*Attorney, Agent, or Firm*—Staas & Halsey

[57] ABSTRACT

A semiconductor integrated device and a method for manufacturing the same, the device comprising an internal semiconductor integrated circuit which includes N-MOS transistors, and a P-MOS output transistor having a source connected to a voltage power supply. The drain of the P-MOS transistor is connected to an output terminal and the output terminal is operatively connected to a device driven by the P-MOS transistor.

6 Claims, 10 Drawing Figures

BUFFER CIRCUIT HAVING A P-CHANNEL OUTPUT MOSFET WITH AN OPEN DRAIN TERMINAL CONNECTED TO AN EXTERNAL LOAD

This is a continuation of co-pending application Ser. No. 833,529, filed on Feb. 25, 1986, now abandoned, which is a continuation of Ser. No. 775,693, filed on Sept. 12, 1985, now abandoned, which is a continuation of Ser. No. 393,113, filed June 28, 1982, now abandoned.

BACKGROUND OF THE INVENTION

1. Field of the Invention

The present invention relates to a semiconductor integrated device and a method for manufacturing the same. More particularly, it relates to a driving device having a high tolerance voltage and being integrated in a semiconductor integrated device for directly driving, for example, a phosphor-fluorescent tube, and a method for easily manufacturing the driving device.

2. Description of the Prior Art

In general, a semiconductor integrated circuit device (hereinafter referred to as an IC device) comprises metal-oxide semiconductor field effect transistors (MOSFETs) driven at a low voltage of, for example, 5 V. Because the operating speed of an N-channel MOSFET (hereinafter referred to as an N-MOS transistor) is higher than the operating speed of a P-channel MOSFET (hereinafter referred to as a P-MOS transistor), N-MOS transistors are usually employed in an IC device.

When a device, such as a phosphor-fluorescent tube used in an electronic calculator, a digital watch, etc., is driven at a high voltage of, for example, 40 volts by an IC device, the IC device should have an output circuit having a high tolerance voltage. Conventionally, an N-MOS output transistor having a high tolerance voltage, is used in the output circuit. The drain of the N-MOS output transistor is directly connected to an output terminal in an open-drain fashion. In the conventional IC device, however, an additional circuit is necessary for driving a device such as a phosphor-fluorescent tube (described in detail later). The additional circuit is provided on the exterior of the IC device. Because of the necessary additional circuit, the number of parts for driving the device is increased and thereby the cost of the system for driving the device is increased. Further, because the drain of the N-MOS output transistor is directly connected to the output terminal in an open-drain fashion, the N-MOS output transistor is off while the device is being driven and is on while the device is not being driven. Therefore, electric power is consumed in the N-MOS output transistor even while the device is not being driven. Usually, the time period during which the device is not driven is longer than the time period during which the device is driven. Thus, in the conventional IC device, there is a problem of large power consumption.

SUMMARY OF THE INVENTION

Accordingly, an object of the present invention is to decrease the cost of the system for driving a device at a high voltage by eliminating the need for an additional circuit to be connected to an output terminal of a semiconductor integrated device when the device is driven by a semiconductor integrated device.

Another object of the present invention is to decrease the power consumption in a semiconductor integrated device when another device is driven at a high voltage by the semiconductor integrated device.

Still another object of the present invention is to provide a semiconductor integrated device including an internal integrated circuit comprising N-MOS transistors operated under a normal operating voltage and a P-MOS output transistor having a high tolerance voltage, the transistors being formed on the same semiconductor substrate.

The main aspect of the present invention resides in a semiconductor integrated device comprising: an internal semiconductor integrated circuit having N-MOS transistors formed on a semiconductor substrate and being connected between a voltage power supply and ground; a P-MOS output transistor formed on the semiconductor substrate, the P-MOS output transistor having a source connected to the voltage power supply, a drain, and a gate to which an output of the internal semiconductor integrated circuit is applied; and an output terminal connected to the drain of the P-MOS transistor, the output terminal being operatively connected to a device driven by the P-MOS transistor.

Another aspect of the present invention resides in a method for manufacturing a semiconductor integrated device having N-MOS transistors and a P-MOS transistor formed on a P-type semiconductor substrate, comprising the steps of: forming an N-type well beneath the surface of the P-type semiconductor substrate; forming channel cut regions for the P-MOS transistor; forming channel cut regions for the N-MOS transistors; forming field oxidation films for isolating elements; forming gate oxidation films; forming polycrystalline-silicon gates; introducing donor atoms so as to form the source and drain regions of the N-MOS transistors; introducing acceptor atoms so as to form an offset region beneath the surface of the N-type well and adjacent to the region under the polycrystalline-silicon gate of the P-MOS transistor; covering the offset region and the region for the N-MOS transistors with resist; introducing acceptor atoms so as to form a source region and a drain region of the P-MOS transistor, the offset region being formed between the region under the polycrystalline silicon gate of the P-MOS transistor and the drain region of the P-MOS transistor; removing the resist; forming a passivation film; and forming electrode contact windows.

BRIEF DESCRIPTION OF THE DRAWINGS

The above objects and features as well as the advantages of the present invention will be better understood from the following detailed description of the embodiments in conjunction with the accompanying drawings in which.

DESCRIPTION OF THE PREFERRED EMBODIMENT

Before describing the embodiment of the invention, a coventional device will first be explained.

Figure 1:
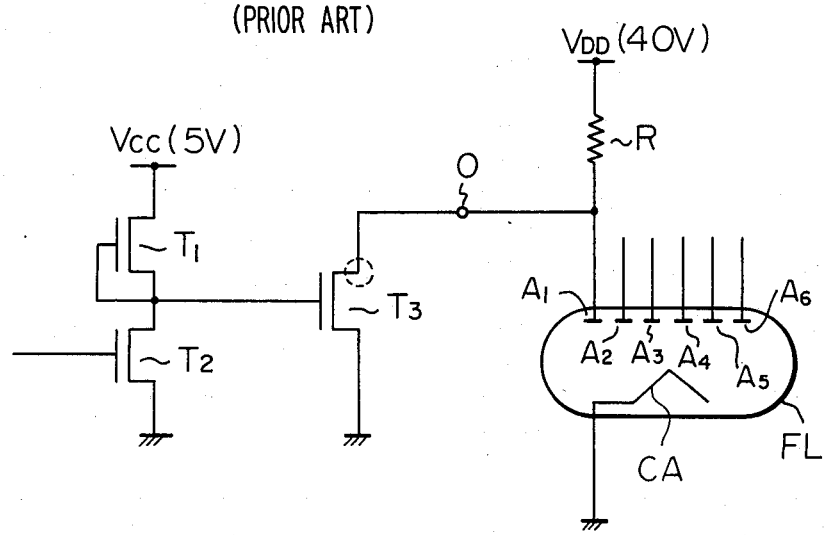
FIGS. 1 and 2 are conventional circuit diagrams of an output stage, of an IC device and a phosphor-fluorescent tube connected to the output stage.

FIG. 1 is an example of a conventional circuit diagram illustrating an output stage, having a high tolerance voltage, of an IC device and a phosphor-fluorescent tube connected to the output stage. In FIG. 1, an inverter INV comprising two N-MOS transistors $T_1$ and $T_2$ is connected in series between a normal low power supply voltage $V_{CC}$ of 5 V and ground. The output of the inverter INV, that is, the common connecting point of the gate and the source of the transistor $T_1$ and the drain of the transistor $T_2$, is connected to the gate of an N-MOS output transistor $T_3$ which has a high tolerance voltage of 40 V. The drain of the transistor $T_3$ is connected to an output terminal O of the IC device in an open-drain fashion. As illustrated by the dashed circle, the drain portion of the transistor $T_3$ has a high tolerance voltage. The source of the transistor $T_3$ is grounded. The transistors $T_1$ through $T_3$ constitute an output stage of an IC device. Between a high voltage power supply of 40 V and the output terminal O, an additional resistor R is connected. Also, an anode electrode $A_1$ of a phosphor-fluorescent tube FL is connected to the output terminal O. The other anode electrodes $A_2$, $A_3$, $A_4$, ... are connected to other output terminals (not shown) of the same IC device. A common cathode electrode CA is provided in the phosphor-fluorescent tube FL. The cathode electrode CA is grounded.

When the output transistor is turned on, a current flows from the high voltage power supply $V_{DD}$ through the resistor R and the transistor $T_3$ to ground, so that the potential at the output terminal O is lowered. Therefore, with respect to the anode $A_1$ connected to the output terminal O, the phosphor-fluorescent tube FL is not lighted while the transistor $T_3$ is turned on. On the other hand, when the output transistor $T_3$ is turned off, the potential at the output terminal O is raised so that a current flows through the resistor R and the phosphor-fluorescent tube FL to ground. Therefore, with respect to the anode $A_1$, the phosphor-fluorescent tube FL is lighted while the transistor $T_3$ is turned off. As a result, even when the phosphor-fluorescent tube FL is not lighted, electric power is consumed in the output transistor $T_3$. Accordingly, in the conventional circuit of FIG. 1, there is a problem of high power consumption. In addition, since the additional resistor R is necessary for driving one anode electrode of the phosphor-fluorescent tube FL, the number of parts for driving all of the anodes of the phosphor-fluorescent tube FL is very large, so that the cost of the total system is high.

Figure 2:
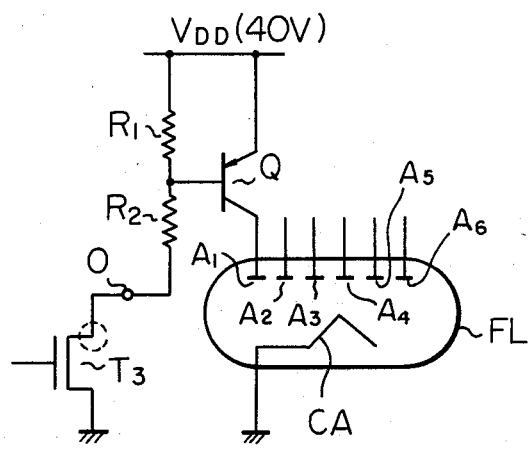

FIG. 2 is another example of a conventional circuit diagram illustrating an output stage, having a high tolerance voltage, of an IC device and a phosphor-fluorescent tube FL connected to the output stage. In FIG. 2, two additional resistors $R_1$ and $R_2$ are connected in series between a high voltage power supply of 40 V and an output terminal O. Further, one additional PNP transistor Q is provided. The base of the PNP transistor Q is connected to the connecting point between the resistor $R_1$ and the resistor $R_2$. The emitter of the transistor Q is connected to the power supply $V_{DD}$. The collector of the transistor Q is connected to an anode electrode $A_1$ of the phosphor-fluorescent tube FL. The remaining portions of the circuit structure are the same as those of the circuit structure of FIG. 1.

In the operation of the circuit of FIG. 2, when the output transistor $T_3$ is turned on, the potential at the base of the PNP transistor Q is lowered so as to turn on the PNP transistor Q, and when the output transistor $T_3$ is turned off, the potential at the base of the transistor Q is raised so as to turn off the PNP transistor Q. Therefore, the output transistor is in an on state only while the phosphor-fluorescent tube FL is lighted. As a result, power consumption in the output transistor $T_3$ is prevented while the phosphor-fluorescent tube FL is not lighted.

However, in the circuit of FIG. 2, two additional resistors and one PNP transistor are necessary for driving one anode of the phosphor-fluorescent tube FL. Therefore, the number of parts for driving all of the anode electrodes of the phosphor-fluorescent tube FL is very large, and, as a result, the cost of the total system is very high.

Now, an embodiment of the present invention will be described with reference to FIGS. 3 and 4A through 4G.

Figure 3:
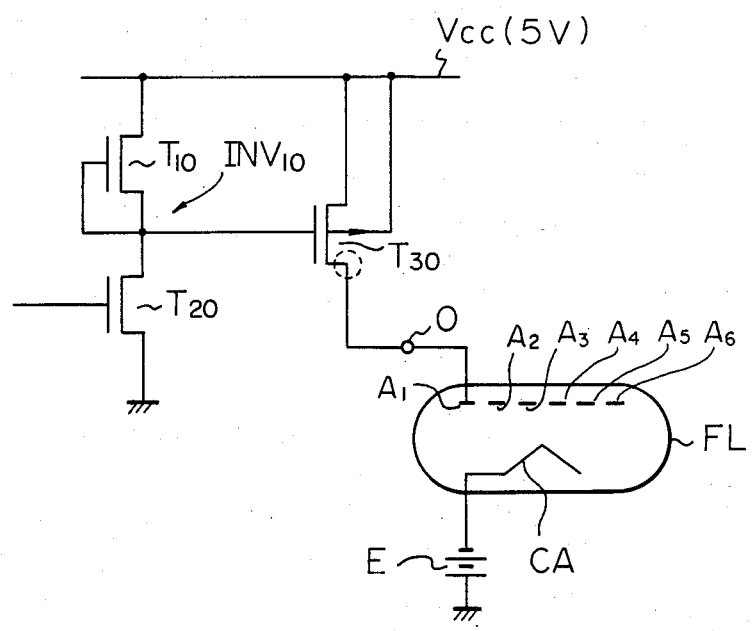
FIG. 3 is a circuit diagram of an output stage, of an IC device and a phosphor-fluorescent tube connected to the output stage, according to an embodiment of the present invention.

FIG. 3 is a circuit diagram of an output stage, having a high tolerance voltage, of an IC device and a phosphor-fluorescent tube connected to the output stage, according to an embodiment of the present invention. In FIG. 3, two N-MOS transistors $T_{10}$ and $T_{20}$ constitute an inverter included in the output stage of an IC device comprising N-MOS transistors. The transistor $T_{10}$ is a depletion-type load transistor, and the transistor $T_{20}$ is an enhancement-type driving transistor. The load transistor $T_{10}$ may alternatively be a resistor. According to the present invention, a P-MOS transistor $T_{30}$ is provided on the same semiconductor substrate as the N-MOS IC. The output of the inverter $INV_{10}$, that is, the common connecting point of the gate and the source of the transistor $T_{10}$ and the drain of the transistor $T_{20}$, is connected to the gate of the P-MOS transistor $T_{30}$. The source of the P-MOS transistor $T_{30}$ is connected to the low voltage power supply of 5 V. The drain of the P-MOS transistor $T_{30}$ is connected, in an open-drain fashion, to an output terminal O of the IC device. As indicated by the dashed circle, the drain portion of the P-MOS transistor $T_{30}$ has a high tolerance voltage. The N-type semiconductor substrate of the P-MOS transistor $T_{30}$, which is formed on the common P-type semiconductor substrate (described in detail later), is connected to the low voltage power supply $V_{CC}$. Therefore, the potential at the source of the P-MOS transistor $T_{30}$ is the same as the potential at the N-type semiconductor substrate, there being an advantage in that there is no back-bias effect, with the result that power consumption is limited in the P-MOS transistor $T_{30}$. As is well known, the P-MOS transistor $T_{30}$ has a negative threshold voltage with respect to the N-type semiconductor substrate. One anode electrode $A_1$ of the phosphor-fluorescent tube FL is connected to the output terminal O. The cathode CA of the phosphor-fluorescent tube FL is connected to a negative electrode of a high voltage power supply E of 40 V. The positive electrode of the power supply E is grounded. No additional parts or circuits are connected to the output terminal O.

In the operation of the circuit of FIG. 3, when the potential at the output of the inverter $INV_{10}$ is at a low level nearly equal to 0 V, the potential of the gate of the P-MOS transistor $T_{30}$ is lower than the negative threshold voltage with respect to the N-type semiconductor substrate, so that the P-MOS transistor $T_{30}$ is turned on. Therefore, a current flows from the low voltage power supply $V_{CC}$ through the transistor $T_{30}$ and the phosphor-fluorescent tube FL to the negative electrode of the high voltage power supply E. On the other hand, when the output of the inverter $INV_{10}$ is a high potential level of about 5 V, the P-MOS transistor $T_{30}$ turns off so that the phosphor-fluorescent tube FL is turned off. In the circuit configuration of FIG. 3, since it is not necessary that any additional parts or circuits be connected to the output terminal O, the number of parts for driving the phosphor-fluorescent tube FL is not large and, therefore, the cost of the total system is lower than that of the conventional system. Also, since the P-MOS output transistor $T_{30}$ turns on only when the phosphor-fluorescent tube FL is turned on, no power is consumed in the transistor $T_{30}$ when the phosphor-fluorescent tube FL is off, with the result that the power consumption is lower than the power consumption in the circuit of FIG. 1.

Figure 4A:
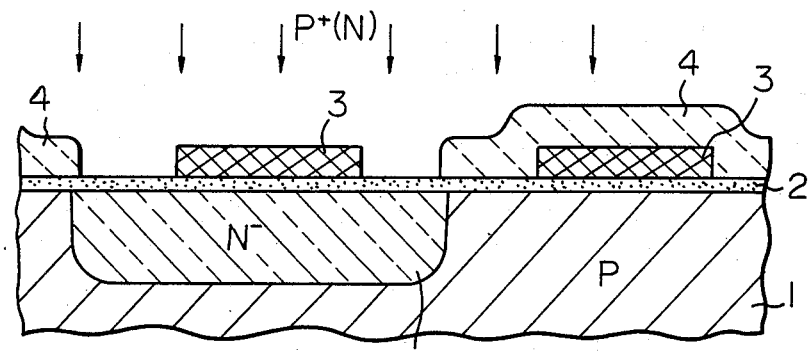
FIGS. 4A through 4G are cross-sectional views of part of the structure of the output stage of the IC of FIG. 3 in each manufacturing step.

Now a method for manufacturing a P-MOS transistor $T_{30}$ having a high tolerance voltage will be described with reference to FIGS. 4A through 4G. According to the present invention, a P-MOS transistor having a high tolerance voltage and N-MOS transistors having a normal tolerance voltage are formed on the same P-type semiconductor substrate. The manufacturing steps are as follows:

Referring to FIG. 4A, the steps include:

(a)
  (1) initially oxidizing the surface of a P-type silicon semiconductor substrate 1 so as to form an oxidation film 2;
  (2) growing a $Si_3N_4$ film 3 on the whole surface of the oxidation film 2;
  (3) removing the $Si_3N_4$ film 3 from the entire surface of the oxidation film 2 except for the regions in which elements are to be formed;
  (4) coating resist 4 on the whole surface;
  (5) removing the resist 4 from the region in which the P-MOS transistor is to be formed so as to form a window;
  (6) implanting phosphorus ions P+ on the whole surface so that the phosphorus ions P+ are injected through the exposed $Si_3N_4$ film 3 so as to form an N-type well 5; and
  (7) removing the resist 4 and treating the entire surface at a high temperature so as to form the N-type well 5 for the P-MOS transistor. FIG. 4A shows the resist 4 before it is removed for the purpose of easy understanding.

Figure 4B:
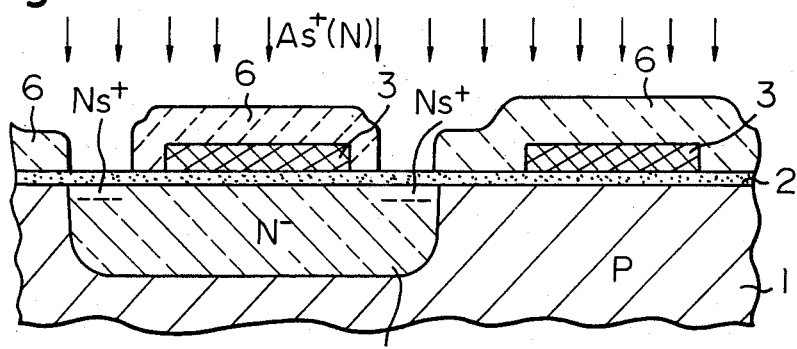

Referring to FIG. 4B, the steps further include:

(b)
  (1) forming a resist 6 to cover the $Si_3N_4$ film 3 provided on the N-type well 5 and to cover the portion where the resist 4 was provided so as to form channel cut regions enabling the P-MOS transistor to have a high tolerance voltage as hereinafter described; and
  (2) implanting a large dose of N-type arsenic ions As+ or phosphorus ions on the whole surface of the resist 6 and the exposed oxidation film 2 so that the arsenic ions As+ are injected into a part of the N-type well 5 which is not covered by the resist 6. The injected N-type arsenic ions As+ are later diffused in the N-type well 5 by a heat treatment so as to form channel cut regions Ns+ which prevent the operation of P-MOS parasitic field effect transistors formed at the surface of the N-type well 5 and under isolation regions 7 (see FIG. 4D). In FIG. 4B, the diffusion process has not yet been effected, and the injected N-type arsenic ion regions are illustrated by the dashed lines.

Figure 4C:
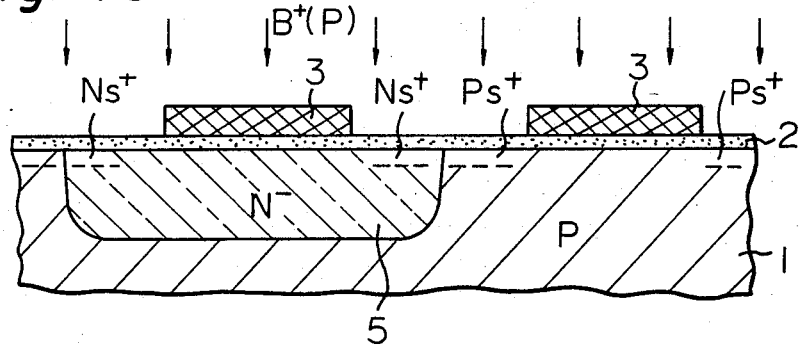
Figure 4D:
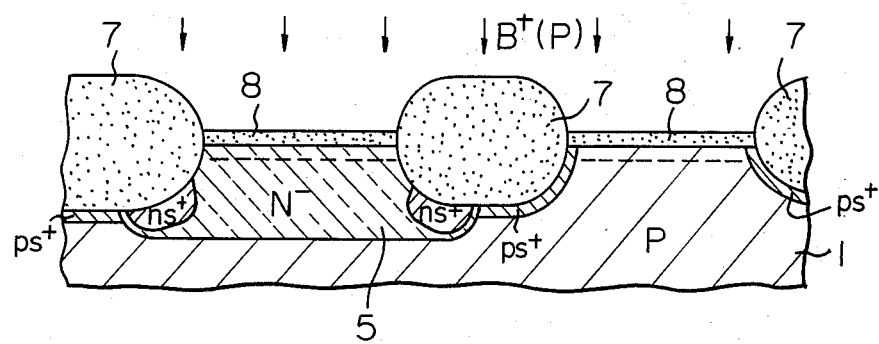

Referring to FIG. 4C, the steps further include:

(c)
  (1) removing the resist 6; and
  (2) implanting a relatively small dose of P-type boron ions B+ on the whole surface of the remaining $Si_3N_4$ film 3 and the exposed oxidation film 2 so as to form channel cut regions Ps+ which prevent the operation of N-MOS parasitic field effect transistors formed at the surface of the P-type semiconductor substrate 1 and under isolation regions 7 (see FIG. 4D). The dose of P-type boron ions B+ should be smaller than the dose of N-type arsenic ions As+ so as to ensure that the conductivity type of the injected arsenic ion regions for the channel cut regions Ns+ is not inverted to a P-type. This step of implanting the P-type boron ions B+ mainly raises the threshold voltage of the N-MOS parasitic field effect transistors. However, the implantation of the boron ions also decreases the concentration of the N-type ions on the surface of the N-type well 5, so that the threshold voltage of the P-MOS parasitic field effect transistors is slightly changed to be easily turned on. In order to avoid the change in the threshold voltage of the P-MOS parasitic field effect transistors, a mask may be used to prevent the boron ions B+ from injecting into the N-type well 5. Of course, even if a mask is not used, the threshold voltage of the P-MOS parasitic field effect transistors can be precisely determined by taking into account the amount of arsenic ions As+ and the amount of boron ions B+ injected into the N-type well 5. In FIG. 4C, the channel cut regions to be formed for the N-MOS transistors are indicated by the dashed lines.

Referring to FIG. 4D, the steps further include:

(d)
  (1) executing field oxidation by means of a heat treatment to cause the injected arsenic ions and the boron ions to be diffused so that the channel cut region ns+ for the P-MOS transistor and the channel cut region ps+ for the N-MOS transistors are formed;
  (2) removing, by etching the $SiO_2$ film covering the $Si_3N_4$ films 3, the remaining $Si_3N_4$ films 3, and the oxidation film 2 so that only isolation regions 7 remain;
  (3) forming gate oxidation films 8;
  (4) implanting boron ions B+ on the whole surface of the exposed oxidation films 8 so as to adjust the threshold voltage of the enhancement-type N-MOS transistors. If necessary, boron ions B+ may be implanted so as to lower the threshold voltage of the P-MOS transistor by using a mask.

Figure 4E:
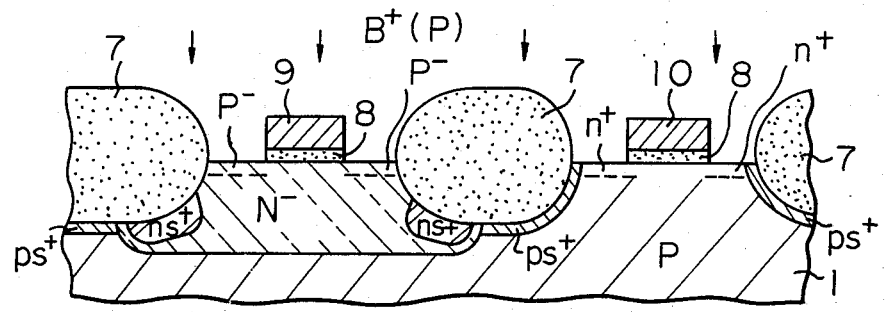

Referring to FIG. 4E, the steps further include:

(e)
  (1) masking the regions other than the regions for depletion-type N-MOS transistors (not shown) and implanting N-type phosphorus ions P+ to determine the threshold voltage of the depletion-type N-MOS transistors;
  (2) growing a polycrystalline-silicon layer;

(3) patterning the polycrystalline-silicon layer so as to form gate electrodes and wiring layers such as a gate electrode 9 of the P-MOS transistor and a gate electrode 10 of the depletion-type N-MOS transistor as illustrated;

(4) masking the region for the P-MOS transistor by using resist and implanting donor atoms such as arsenic ions As+ having a concentration of $4 \times 10^{15}$ cm$^{-2}$ so as to form the sources and the drains of the N-MOS transistors after heat treatment; and (5) removing the resist used in the above step (4) and implanting P-type boron ions B+ having a concentration of about $1 \times 10^{12}$ cm$^{-2}$ so as to form a P$^-$-type layer beneath the surface of the N-type well 5 so that the gate of the P-MOS transistor has an offset structure having a high tolerance voltage. Such a low concentration of $1 \times 10^{12}$ has almost no influence on the threshold voltage of the N-MOS transistors.

Figure 4F:
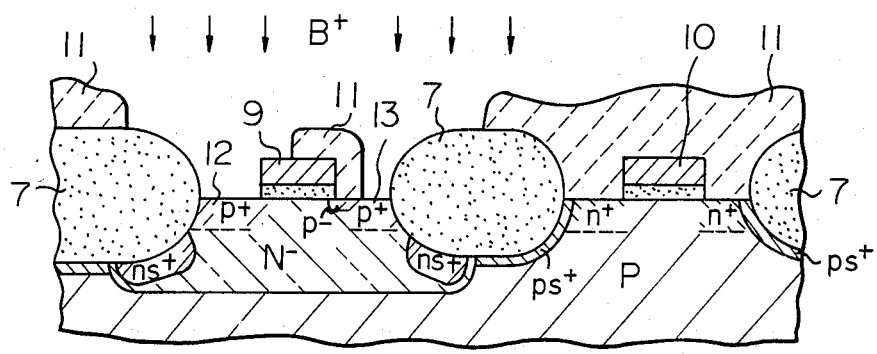

Referring to FIG. 4F, the steps further include:

(f)

(1) covering with resist 11, all the regions except for the region in which the P-MOS transistor is formed, a half of the gate 9 of the P-MOS transistor, and a region adjacent to a region in which a drain region is formed, so as to form an offset gate; and (2) implanting boron ions B+ so as to form the drain 12 and the source 13 after heat treatment.

Next, similar to the conventional MOS manufacturing process, the following steps are executed: removing the resist 11; forming a block oxidation film so as to prevent phosphor in a passivation film such as a phosphosilicate glass (PSG) film, which is used later, from diffusing into the active regions; forming a block nitride film; forming a passivation film such as a PSG film; forming electrode contact windows; executing heat treatment and annealing; aluminum wiring; forming a cover film; and effecting back surface treatment. Thus, an IC device including a P-MOS transistor having a high tolerance voltage is manufactured completely.

Figure 4G:
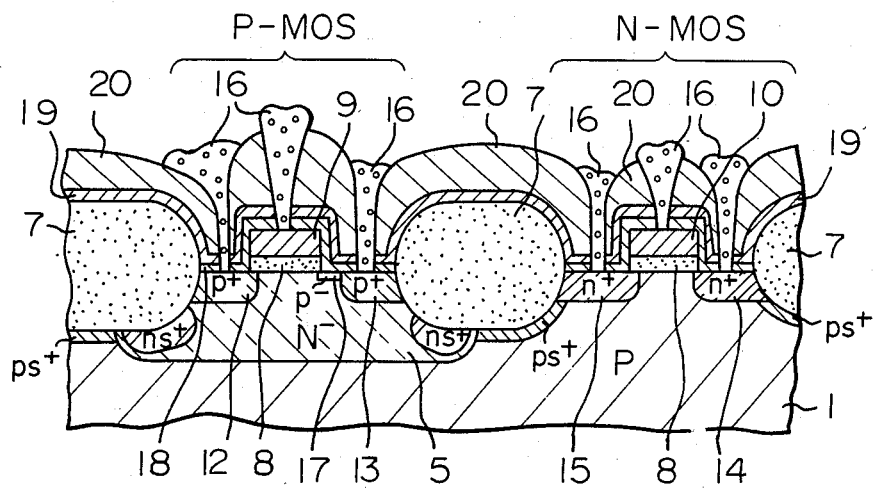

FIG. 4G is a cross-sectional view illustrating a part of the completely manufactured IC device. In FIG. 4G, 1 is the common P-type semiconductor substrate; 5 is the N-type well serving as the substrate of the P-MOS transistor; 7 represents the isolation regions; 8 represents the gate oxidation films; 9 is the polycrystalline-silicon gate electrode of the P-MOS transistor; 10 is the polysilicon gate electrode of the N-MOS transistor; 12 and 13 are, respectively, the source and drain of the P-MOS transistor; 14 and 15 are, respectively, the source and drain of the N-MOS transistor; 16 represents aluminum wirings in contact with the sources, the drains, and the gates; 17 is the P$^-$-type offset region formed beneath the surface of the N-type well 5 and between the region under the gate 9 and the P+-drain 12; 18 is the block oxidation film; 19 is the block nitride film; and 20 represents the PSG.

Because of the presence of the offset region 17, the drain 12 of the P-MOS transistor has a high tolerance voltage of more than 30 V.

From the foregoing description, it will be apparent that, according to the present invention, a P-MOS output transistor having a drain with a high tolerance voltage can be easily manufactured on the same semiconductor substrate as an internal N-MOS IC.

In addition, by using the semiconductor integrated device of the present invention including the P-MOS output transistor having a high tolerance voltage, a device driven at a high voltage can be driven without the need for an additional element or circuit, and, thus, the cost of the system for driving the device can be decreased.

Further, since the drain of the P-MOS output transistor is connected in an open-drain fashion to the output terminal of the semiconductor integrated circuit, electric power is consumed in the P-MOS output transistor only while the driven device is on, and, therefore, the electric power consumption is decreased in comparison with the conventional device.

What is claimed is:

1. A semiconductor integrated device, having a semiconductor substrate and operatively connected to an external device, for driving the external device, comprising:

an N-MOS internal semiconductor integrated circuit, having a final output stage including a load element and an N-MOS driver transistor, said load element and said N-MOS driver transistor formed on the semiconductor substrate and operatively connected in series between a voltage power supply and ground, for generating an output;

a P-MOS output transistor formed on the semiconductor substrate, said P-MOS output transistor having a source operatively connected to the voltage power supply, having a gate, operatively connected to a connecting point between said load element and said N-MOS driver element, for receiving said output of said internal semiconductor integrated circuit, and having a drain, said drain having a voltage tolerance higher than that of said source; and an output terminal operatively connected to said drain of said P-MOS output transistor, said output terminal being operatively connected to the external device which is driven by said P-MOS output transistor.

2. A semiconductor integrated device as set forth in claim 1, wherein the semiconductor substrate is P conductivity type and comprises an N-type well formed in the P-type semiconductor substrate, said P-MOS output transistor being formed on said N-type well.

3. A semiconductor integrated device having a semiconductor substrate and operatively connected to an external device to be driven, comprising:

an N-MOS internal semiconductor integrated circuit, having a final output stage including a load element and having a driver element of a first conductivity type, said load element and said driver element formed on the semiconductor substrate and operatively connected in series between a voltage power supply and ground, for generating an output;

a transistor of a second conductivity type, opposite that of the first conductivity type, formed on the semiconductor substrate, said transistor having a source operatively connected to the voltage power supply, having a gate, operatively connected to a connecting point between said load element and said driver element, for receiving said output from said internal semiconductor integrated circuit and having a drain, said drain having a voltage tolerance higher than that of said source; and an output terminal operatively connected to said drain of said transistor and to the external device to be driven.

4. A semiconductor integrated device as set forth in claim 3, wherein said semiconductor substrate is of the second conductivity type and comprises a well of the first conductivity type formed in the semiconductor substrate, said transistor being formed on said well.

5. A semiconductor integrated device as set forth in claim 3, wherein said transistor comprises an offset region of the second conductivity type, formed beneath the surface of said well and between the region under said gate and drain of said transistor.

6. A semiconductor integrated device for driving an external high voltage device comprising:
   an internal semiconductor integrated circuit formed on a semiconductor substrate and including transistors, all of said transistors in said internal semiconductor substrate being N-MOS transistors, and including a final output stage which is an inverter having an output terminal, said inverter including:
   a first transistor being a load element having drain operatively connected to a power supply and having a source and a gate operatively connected to said output terminal of said inverter; and
   a second transistor being an enhancement-type N-MOS driving transistor, said enhancement-type N-MOS driving transistor having a source connected to ground, having a drain connected to said output terminal of said inverter, and having a gate operatively connected to receive a control signal; and
   a P-MOS open drain type output transistor formed on said semiconductor substrate having a source operatively connected to the power supply, having a drain operatively connected to the external high voltage device, and having a gate operatively connected to said output terminal of said inverter.

* * * * *